US012562718B2

(12) United States Patent
Akahane

(10) Patent No.: US 12,562,718 B2
(45) Date of Patent: Feb. 24, 2026

(54) CLOCK GENERATING APPARATUS AND DRIVING APPARATUS

(71) Applicant: FUJI ELECTRIC CO., LTD.,
Kanagawa (JP)

(72) Inventor: Masashi Akahane, Matsumoto (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 158 days.

(21) Appl. No.: 18/452,587

(22) Filed: Aug. 21, 2023

(65) Prior Publication Data

US 2024/0106418 A1 Mar. 28, 2024

(30) Foreign Application Priority Data

Sep. 26, 2022 (JP) ................................. 2022-153001

(51) Int. Cl.
H03K 3/011 (2006.01)
H03K 17/14 (2006.01)
(52) U.S. Cl.
CPC ............. H03K 3/011 (2013.01); H03K 17/14
(2013.01)
(58) Field of Classification Search
CPC ............................... H03K 3/011; H03K 17/14
See application file for complete search history.

(56) References Cited

FOREIGN PATENT DOCUMENTS

| DE | 102017124390 A1 * | 5/2018 | ............... H03L 1/04 |
|---|---|---|---|
| JP | 2003332891 A | 11/2003 | |
| JP | 2004056561 A | 2/2004 | |
| JP | 2008099093 A | 4/2008 | |
| JP | 2021170716 A | 10/2021 | |
| KR | 101725693 B1 * | 4/2017 | ............. H03K 3/011 |

OTHER PUBLICATIONS

Ken Ueno et al., "A fully-integrated Clock Reference Generator
with Frequency-locked Loop", Institute of Electronics, Information
and Communication Engineers, Institute of Electronics, Information
and Communication Engineers technical report (IEICE Technical
Report) 109(214), pp. 159-164, Oct. 2009.

* cited by examiner

*Primary Examiner* — Lincoln D Donovan
*Assistant Examiner* — James G Yeaman

(57) ABSTRACT
Provided is a clock generating apparatus including a voltage
control oscillator that outputs a clock corresponding to a
control voltage which is input, a control voltage generator
that generates the control voltage corresponding to a differ-
ence between a frequency of the clock and a target fre-
quency, a starting voltage generator that generates a starting
voltage which is supplied to the voltage control oscillator
during a start period of the voltage control oscillator, and a
starting circuit that sets the control voltage to the starting
voltage during the start period after a start-up of the voltage
control oscillator.

20 Claims, 13 Drawing Sheets clken

Vout

FREQUENCY
IS UNSTABLE

Fout

TIME t

| TEMPERATURE | INPUT | | OUTPUT | | |
|---|---|---|---|---|---|
| | OTMEN | OTHEN | TL | TM | TH |
| <T1 | 0 | 0 | 1 | 0 | 0 |
| <T2 | 1 | 0 | 0 | 1 | 0 |
| ≧T2 | 1 | 1 | 0 | 0 | 1 |

*FIG.10*

| INPUT | | | | | | OUTPUT |
|---|---|---|---|---|---|---|
| TEMPERATURE | CURRENT | TL | TM | TH | ILOW | IDREF |
| $\geqq$T2 | | 0 | 0 | 1 | | V1 |
| <T2 | | 0 | 1 | 0 | | V2 |
| <T1 | $\geqq$I1 | 1 | 0 | 0 | 0 | V3 |
| | <I1 | 1 | 0 | 0 | 1 | V4 |

*FIG.12*

CLOCK GENERATING APPARATUS AND DRIVING APPARATUS

The contents of the following patent application(s) are incorporated herein by reference: NO. 2022-153001 filed in JP on Sep. 26, 2022

BACKGROUND

1. Technical Field

The present invention relates to a clock generating apparatus and a driving apparatus.

2. Related Art

Patent document 1 discloses an oscillation frequency correction circuit that includes a frequency detection circuit and that selects, according to a voltage level of a divided voltage signal, a delay circuit which is interposed in an oscillation path of the ring oscillator (claim 1), "the frequency detection circuit detecting a variation in oscillation frequency of the ring oscillator and including: a transistor having one signal electrode connected to a power supply and having a driving electrode to which an output signal of the ring oscillator is applied; a resistance element which is provided between the other signal electrode of the transistor and the ground; and a capacitor circuit which is connected in parallel to the resistance element, and which includes a plurality of capacitors connected in series to output a divided voltage signal indicating a voltage level value from each connection end" (claim 1).

Patent Document 2 discloses that "a ring oscillator 2 has a characteristic in which an oscillation frequency decreases as a voltage which is supplied rises. Therefore, in Embodiment 1, when the ring oscillator 2 has a positive temperature characteristic, by a power supply voltage Vd which is supplied to the ring oscillator 2, being caused to also have the positive temperature characteristic, a correction is performed to suppress a change in the oscillation frequency with respect to the temperature" (Paragraph 0017).

Patent Document 3 discloses an oscillating circuit including: "a ring oscillator for which the plurality of inverters are connected in a ring shape; at least one capacitor selectively connected to an output terminal of at least one desired inverter among the plurality of inverters; and at least one current adjustment transistor selectively connected to a power supply terminal of the inverter whose output terminal is connected with the capacitor, among the plurality of inverters, which adjusts an operational current for operating the inverter" (claim 1).

Non-Patent Document 1 discloses a reference clock source circuit that "generates a clock pulse with a low temperature dependence based on a frequency-locked loop technology" (refer to page 2, left column 2). The reference clock source circuit has a bias current generating circuit using "low resistance polysilicon Rp with a positive temperature dependence and high resistance polysilicon R N with a negative temperature dependence" (refer to page 2, left column 2.1.1).

Patent Document 4 discloses that "next, an enable signal EN is set to transition to a high level, to be changed into an inactive state" (paragraph 0071), and "at this time, a switch unit becomes conductive (ON), and a voltage level of a control line VR becomes a predetermined voltage VR2 by a potential generating circuit 21, instead of a control unit 71 in a floating state. Here, it is preferable that the predetermined voltage VR2 has a voltage level equivalent to that of an oscillation frequency control signal VR" (paragraph 0072), and "when the enable signal EN transitions to a low level again and is changed into an active state, the switch unit 11 becomes non-conductive (OFF), the potential generating circuit 21 is disconnected from the control line VR, and both the control unit 71 and an oscillation unit 810 are activated" (paragraph 0073).

PRIOR ART DOCUMENT

Patent Document

Patent Document 1: Japanese Patent Application Publication No. 2004-56561
Patent Document 2: Japanese Patent Application Publication No. 2021-170716
Patent Document 3: Japanese Patent Application Publication No. 2008-99093
Patent Document 4: Japanese Patent Application Publication No. 2003-332891

Non-Patent Document

Non-Patent Document 1: Ken UENO, Tetsuya ASAI, and Yoshihito AMEMIYA, "A fully-integrated Clock Reference Generator with Frequency-locked Loop", Institute of Electronics, Information and Communication Engineers, Institute of Electronics, Information and Communication Engineers technical report (IEICE Technical Report) 109(214), pp. 159-164, October 2009

BRIEF DESCRIPTION OF THE DRAWINGS

FIG. 10 shows an input and output of the temperature detection circuit 130 according to the second embodiment.

FIG. 12 shows an input and output of a voltage output circuit 160 according to the second embodiment.

DESCRIPTION OF EXEMPLARY EMBODIMENTS

Hereinafter, an embodiment of the present invention will be described. The embodiment does not limit the invention according to the claims. In addition, not all combinations of features described in the embodiment are essential to the solution of the invention.

Figure 1:
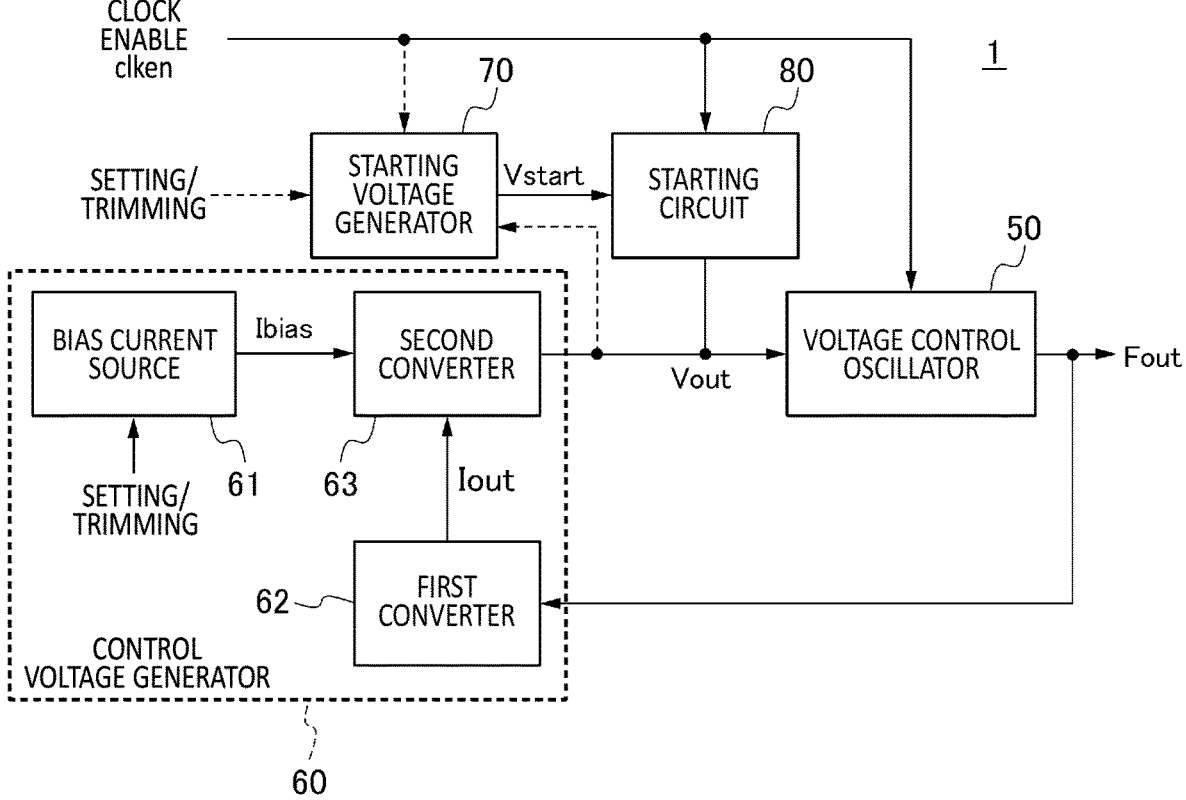
FIG. 1 shows a configuration of a clock generating apparatus 1 according to a first embodiment.

FIG. 1 shows a configuration of a clock generating apparatus 1 according to a first embodiment. The clock generating apparatus 1 outputs a clock Fout of a predetermined frequency (also referred to as a "target frequency"). The clock Fout is a signal having a clock pulse for each period of 1/target frequency. Here, the clock generating apparatus 1 has a function of switching between outputting and not outputting the clock Fout, according to a clock enable clken which is a signal for providing an instruction to switch between enabling and disabling the clock output.

The clock generating apparatus 1 includes a voltage control oscillator 50, a control voltage generator 60, a starting voltage generator 70, and a starting circuit 80. The voltage control oscillator 50 outputs the clock Fout corresponding to a control voltage Vout which is input. In the present embodiment, the voltage control oscillator 50 receives the clock enable clken, and stops outputting the clock Fout (that is, does not output the clock pulse) during a period in which the clock enable clken is a value for providing the instruction to disable the clock). When the clock enable clken is changed into a value for providing the instruction to enable the clock, the voltage control oscillator 50 is started, and begins to output the clock Fout (that is, begins to output the clock pulse).

The control voltage generator 60 receives the clock Fout of the voltage control oscillator 50, and generates the control voltage Vout corresponding to a difference between the frequency of the clock Fout and the target frequency. The control voltage generator 60 performs a feedback control on the voltage control oscillator 50 by receiving the clock Fout which is output from the voltage control oscillator 50, generating the control voltage Vout to cause the frequency of the clock Fout to approach the target frequency, and supplying the control voltage Vout to the voltage control oscillator 50. The control voltage generator 60 of the present embodiment has a bias current source 61, a first converter 62, and a second converter 63.

The bias current source 61 generates a bias current Ibias corresponding to the target frequency of the clock to be output by the voltage control oscillator 50. That is, the voltage control oscillator 50 outputs the clock Fout whose frequency varies according to a magnitude of the bias current Ibias which is generated by the bias current source 61, and thus the magnitude of the bias current Ibias which is generated by the bias current source 61 serves as a parameter for determining the target frequency of the clock Fout which is output by the voltage control oscillator 50. The bias current source 61 may output the bias current Ibias having a fixed magnitude, may output the bias current Ibias having a magnitude set externally, or may output the bias current Ibias having a magnitude adjusted by trimming at a time of a shipment from a factory or the like. In addition, the bias current source 61 may have a setting register for setting the magnitude of the bias current Ibias with a digital value.

The first converter 62 receives the clock Fout and converts the clock Fout into a current. Accordingly, the first converter 62 outputs a feedback current Iout corresponding to the frequency of the clock Fout. In the example of the present figure, the first converter 62 outputs the feedback current Iout which is higher as the frequency of the clock Fout increases.

The second converter 63 receives the bias current Ibias from the bias current source 61, and receives the feedback current Iout from the first converter 62. The second converter 63 outputs the control voltage Vout corresponding to a difference between the bias current Ibias and the feedback current Iout. Here, the second converter 63 adjusts the control voltage Vout such that the difference between the bias current Ibias and the feedback current Iout approaches zero. This allows the second converter 63 to adjust the control voltage Vout of the voltage control oscillator 50 so as to output the clock Fout having a frequency at which the magnitude of the feedback current Iout is equal to the magnitude of the bias current Ibias.

As described above, in the present embodiment, the clock generating apparatus 1 has a current-feedback-type configuration to output the control voltage Vout such that the feedback current Iout corresponding to the frequency of the clock Fout approaches the bias current Ibias corresponding to the target frequency. Instead of this, the clock generating apparatus 1 may have a voltage-feedback-type configuration to output the control voltage Vout such that a feedback voltage corresponding to the frequency of the clock Fout approaches a bias voltage corresponding to the target frequency.

The starting voltage generator 70 generates a starting voltage Vstart which is supplied to the voltage control oscillator 50 during a start period of the voltage control oscillator 50. Here, the "start period" of the voltage control oscillator 50 means a period until the voltage control oscillator 50 starts a normal operation by using the control voltage Vout corresponding to the frequency feedback of the clock Fout (a period whose length is not 0), after the voltage control oscillator 50 switches from the output stop state of the clock Fout to the output state of the clock Fout (after a start-up) in response to the clock enable clken having changed from a value for providing the instruction to stop the clock Fout (the disabling) to a value for providing the instruction to output the clock (the enabling).

The starting voltage generator 70 may output the starting voltage Vstart having a fixed magnitude, may output the starting voltage Vstart having a magnitude set externally, or may output the starting voltage Vstart having a magnitude adjusted by trimming at the time of the shipment from the factory or the like. In addition, the starting voltage generator 70 may have a setting register for setting the magnitude of the starting voltage Vstart with the digital value.

In addition, the starting voltage generator 70 may receive the clock enable clken and the control voltage Vout as indicated by a dashed line, acquire the control voltage Vout while the voltage control oscillator 50 is normally operating by the frequency feedback, and output the control voltage Vout as the starting voltage Vstart. A modification example of such a starting voltage generator 70 will be described below with reference to FIG. 7.

The starting circuit 80 is connected to the starting voltage generator 70. The starting circuit 80 receives the clock enable clken, and sets the control voltage Vout to the starting voltage Vstart according to the clock enable clken, during the start period after the start-up of the voltage control oscillator 50. In the example of the present figure, the starting circuit 80 pulls up the control voltage Vout which is input to the voltage control oscillator 50 to the starting voltage Vstart. Instead of this, the starting circuit 80 may have a configuration for receiving the control voltage Vout from the control voltage generator 60, and the Vstart from the starting voltage generator 70; selecting the starting voltage Vstart to supply the starting voltage Vstart to the voltage control oscillator 50 during the start period after the start-up of the voltage control oscillator 50; and selecting the control voltage Vout from the control voltage generator 60 to supply the control voltage Vout to the voltage control oscillator 50 during the normal operation of the voltage control oscillator 50.

Figure 2:
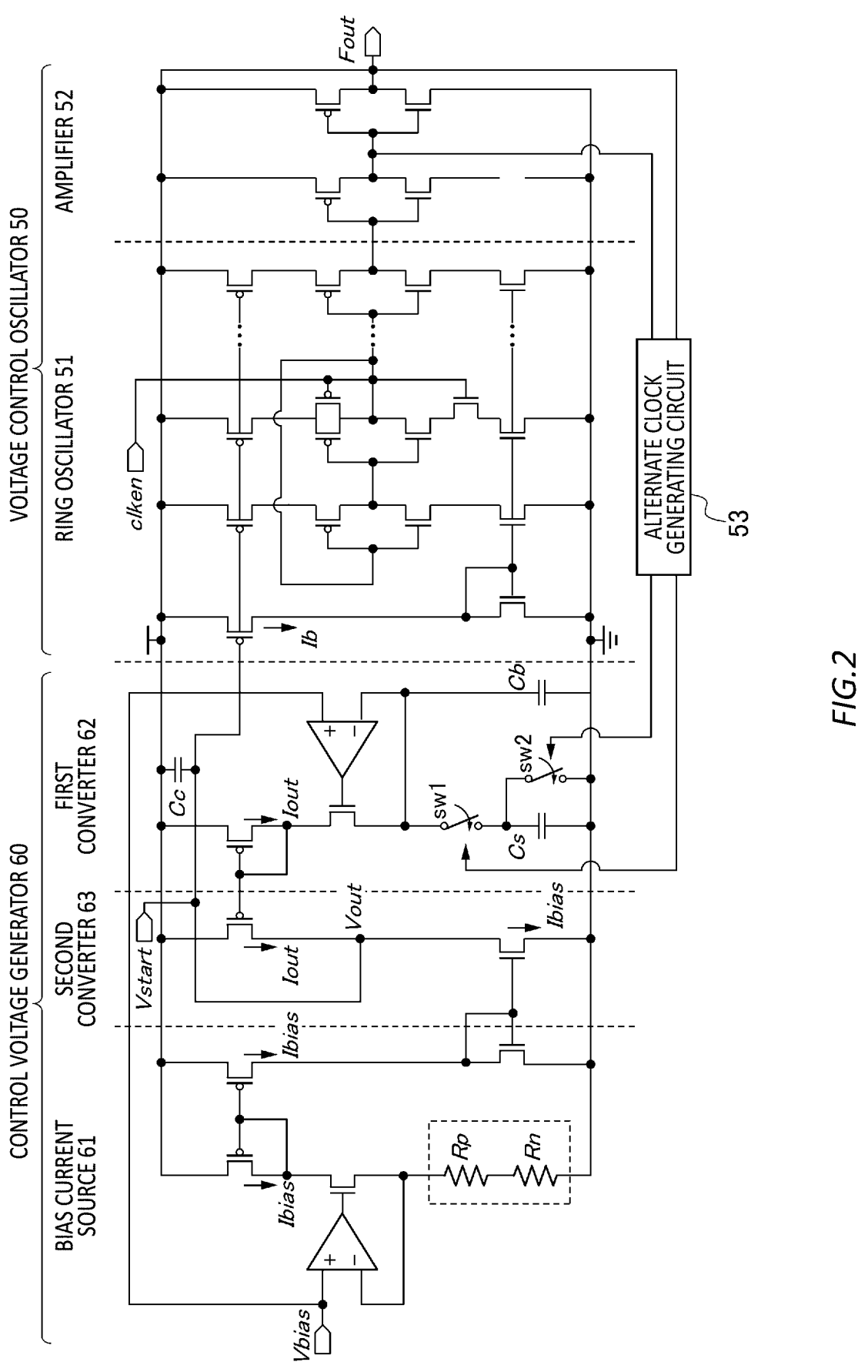
FIG. 2 shows examples of circuit configurations of a voltage control oscillator 50 and a control voltage generator 60 according to the first embodiment.

FIG. 2 shows examples of circuit configurations of a voltage control oscillator 50 and a control voltage generator 60 according to the first embodiment. The present figure shows the circuit configuration of the voltage control oscillator 50 and the control voltage generator 60 when a clock source circuit described in FIG. 1 of Non-Patent Document 1 is used for the voltage control oscillator 50 and the control voltage generator 60 of FIG. 1. In FIG. 2, with respect to the clock source circuit of Non-Patent Document 1, a function of enabling or disabling the clock Fout by the clock enable clken and a function of pulling up the control voltage Vout to the starting voltage Vstart are added.

In the example of the present figure, the voltage control oscillator 50 has a ring oscillator 51, an amplifier 52, and an alternate clock generating circuit 53. The ring oscillator 51 includes an odd number of stages of inverters in a ring connection. In the example of the present figure, a circuit in which an inverter of an even-numbered stage (for example, a second stage) outputs a logically inverted value of the input in a case where the clock enable clken is a logic H (logic high) (a case of the enabling), and forcibly sets the output to the logic H in a case where the clock enable clken is a logic L (logic low) (a case of the disabling), is added. In the example of the present figure, such an inverter is realized by a NAND gate. When the clock enable clken is the logic L, the signal of the logic H which is output by the inverter of the second stage becomes the signal of the logic L through the inverter of the remaining odd-numbered stage, and is output as the clock Fout which is constantly the L through the amplifier 52. It should be noted that the ring oscillator 51 may suppress oscillations of a plurality of inverters in the ring connection, when the clock enable clken provides the instruction of the disabling, by another circuit configuration.

The ring oscillator 51 includes a current mirror circuit that supplies, to each inverter, a current Ib corresponding to the control voltage Vout. In this current mirror circuit, the control voltage Vout is input to a gate of a PMOSFET on a power supply side of each inverter, and a gate voltage of the same voltage as that of an NMOSFET that causes the current Ib to flow is input to a gate of the NMOSFET on a ground side of each inverter, thereby supplying the current Ib to each inverter. In the example of the present figure, as the control voltage Vout rises, the current Ib flowing through the PMOSFET decreases, and as a result, as an amount of a delay of each inverter becomes great, an oscillation frequency of the ring oscillator 51 decreases.

The amplifier 52 amplifies the clock from the ring oscillator 51 by an inverting amplifier circuit of two stages and outputs the amplified clock as the clock Fout. The alternate clock generating circuit 53 receives the inverted and non-inverted clocks Fout in the amplifier 52 and generates alternate clocks which are two clocks in which ON periods do not overlap each other (not overlapping). Each of the two clocks of the alternate clocks has the same frequency as the clock Fout.

The control voltage generator 60 has the bias current source 61, the first converter 62, and the second converter 63. The bias current source 61 generates, by applying a bias voltage Vbias to resistors (Rp+Rn), the bias current Ibias (=Vbias/(Rp+Rn)). The bias current source 61 supplies the generated bias current Ibias to the second converter 63 by the current mirror circuit.

It should be noted that the resistor Rp is a resistor using low resistance polysilicon having a positive temperature dependence, and the resistor Rn is a resistor using and high resistance polysilicon having a negative temperature dependence. This makes it possible for the resistor (Rp+Rn) as a set of the resistors Rp and Rn, by the temperature dependence being canceled out, to keep a resistance value to be substantially constant regardless of a temperature. The clock generating apparatus 1 that generates the bias current Ibias by using such a resistor (Rp+Rn) can improve a temperature characteristic of the frequency of the clock Fout, and suppress a change in the frequency of the clock Fout accompanying a change in the temperature.

The first converter 62 includes a switched capacitor circuit that is operated by the alternate clock from the alternate clock generating circuit 53. The switched capacitor circuit operates as a resistor with a resistance value of $(Cs \cdot Fout)^{-1}$. Accordingly, the first converter 62 generates the feedback current Iout (=Fout·Cs·Vbias) proportional to the oscillation frequency of the voltage control oscillator 50. The first converter 62 supplies the generated feedback current Iout to the second converter 63 by the current mirror circuit.

The second converter 63 has a configuration in which the PMOSFET connected to the power supply side to cause the feedback current Iout to flow, and the NMOSFET connected to the ground side to cause the bias current Ibias to flow, are connected in series. The second converter 63 outputs the voltage between these PMOSFET and NMOSFET as the control voltage Vout. In the second converter 63, when Ibias>Iout, a potential of a node that outputs the control voltage Vout decreases, thereby decreasing the control voltage Vout. As a result, the voltage control oscillator 50 raises the feedback current Iout by raising the frequency of the clock Fout. In addition, in the second converter 63, when Ibias<Iout, the potential of the node that outputs the control voltage Vout rises, thereby raising the control voltage Vout. As a result, the voltage control oscillator 50 decreases the feedback current Iout by decreasing the frequency of the clock Fout. In this way, the second converter 63 adjusts the control voltage Vout such that the feedback current Iout approaches the bias current Ibias.

Wiring that supplies the control voltage Vout from the second converter 63 to the voltage control oscillator 50 receives the starting voltage Vstart from the starting voltage generator 70 via the starting circuit 80. When the starting voltage Vstart is supplied from the starting circuit 80, the control voltage Vout is forcibly set to the starting voltage Vstart.

Figure 3:
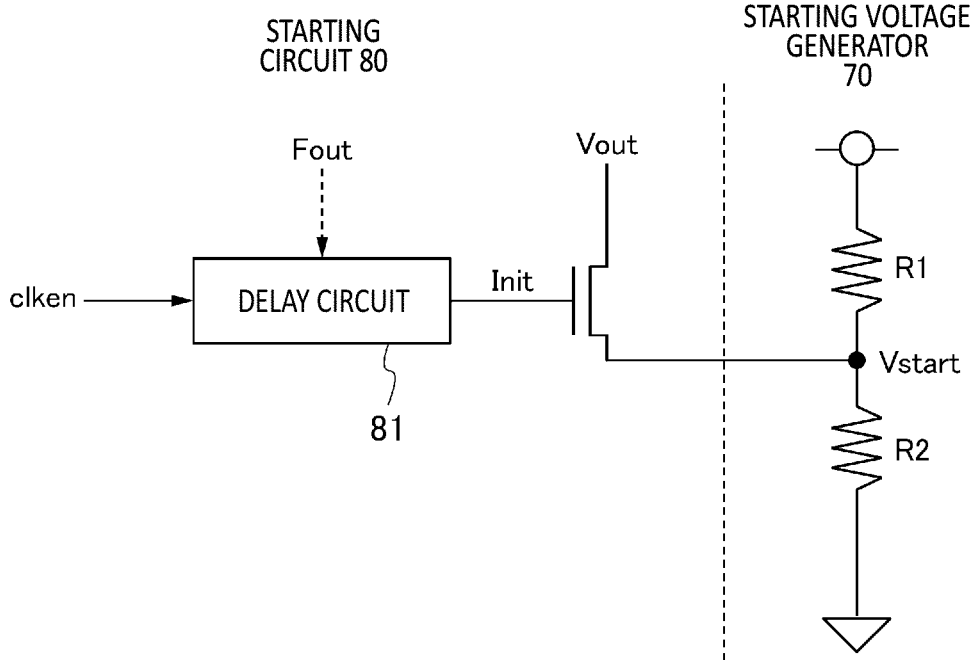
FIG. 3 shows examples of circuit configurations of a starting voltage generator 70 and a starting circuit 80 according to the first embodiment.

FIG. 3 shows examples of circuit configurations of a starting voltage generator 70 and a starting circuit 80 according to the first embodiment. In the example of the present figure, the starting voltage generator 70 includes resistors R1 and R2 connected in series, divides the power supply voltage by the resistors R1 and R2, and outputs the divided voltage as the starting voltage Vstart.

The starting circuit 80 includes a delay circuit 81 that delays the clock enable clken. The delay circuit 81 outputs a start signal Init which takes the logic value (logic H) indicating that the start is in progress during the start period after the clock enable clken becomes the logic H; and takes the logic value (logic L) indicating that the start is done after the start period, by delaying the clock enable clken. In addition, the starting circuit 80 includes a switch (the MOSFET in the example of the present figure) which is turned on to output the starting voltage Vstart as the control voltage Vout while the start signal Init which is output by the delay circuit 81 is the logic H; and is turned off not to supply the starting voltage Vstart to the voltage control oscillator 50 when the start signal Init is the logic L.

Figure 4:
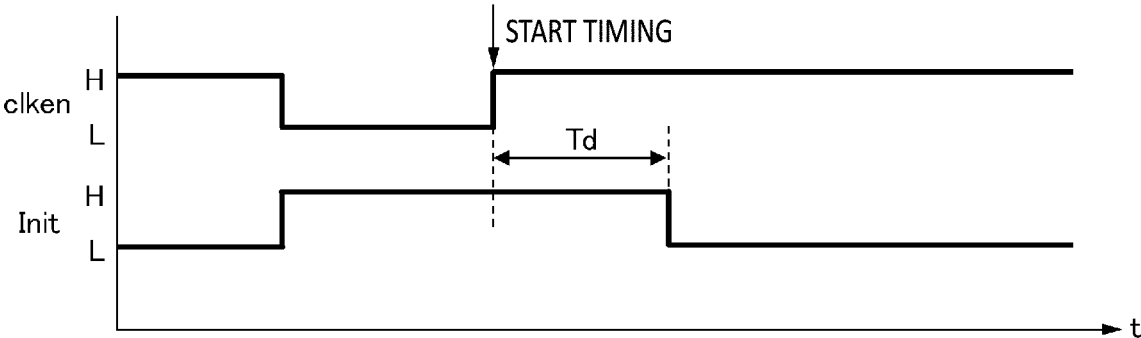
FIG. 4 shows an operation timing of a delay circuit 81 shown in FIG. 3.

FIG. 4 shows an operation timing of a delay circuit 81 shown in FIG. 3. The delay circuit 81 sets the start signal Init to the logic H, during the start period of a length Td (Td>0) after a timing of the start-up ("a start timing" in the figure) at which the clock enable clken changes from the logic L to the logic H; and sets the start signal Init to the logic L after the start period elapses from the start timing. Accordingly, the starting circuit 80 sets the control voltage Vout to the starting voltage Vstart during the start period, and supplies the control voltage Vout from the second converter 63 to the voltage control oscillator 50 after the start period elapses.

It should be noted that in the example of the present figure, the delay circuit 81 switches the start signal Init from the logic L to the logic H according to the change of the clock enable clken from the logic H to the logic L. Accordingly, the delay circuit 81 sets the control voltage Vout to the starting voltage Vstart, during a stop of the voltage control oscillator 50 before the start-up, and until the start period elapses after the start-up of the voltage control oscillator 50.

Figure 5:
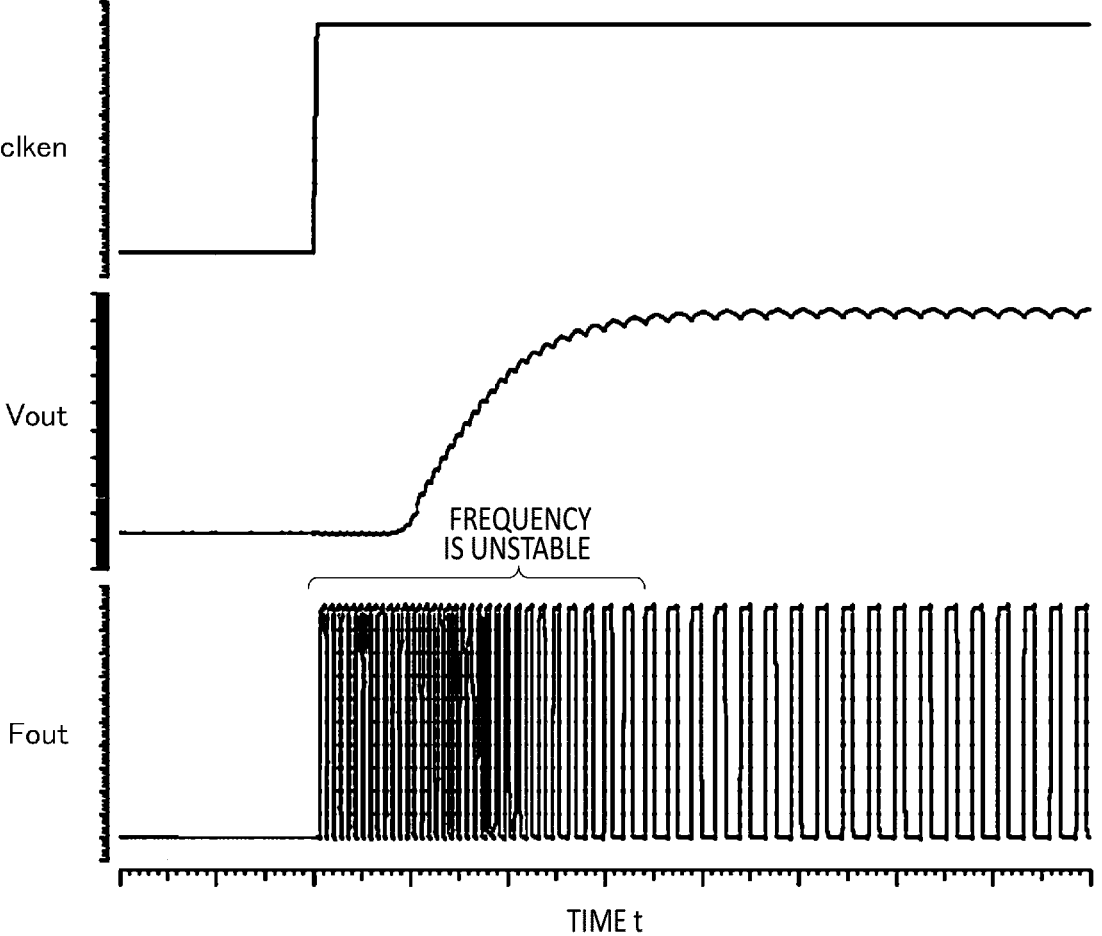
FIG. 5 shows an operation timing in a comparison example of the clock generating apparatus 1.

FIG. 5 shows an operation timing in a comparison example of the clock generating apparatus 1. In the present comparison example, the clock generating apparatus 1 does not have the starting voltage generator 70 and the starting circuit 80, and does not set the control voltage Vout to the starting voltage Vstart during the start period of the voltage control oscillator 50.

The voltage control oscillator 50 maintains the clock Fout to be the logic L while the clock enable clken is the logic L. The alternate clock generating circuit 53 in the voltage control oscillator 50 turns on a switch sw1 and turns off a switch sw2. As a result, the first converter 62 sets the current Iout to zero. The second converter 63 sets the control voltage Vout to 0 [V] according to the current Iout becoming 0 [A].

When the clock enable clken changes from the logic L to the logic H and the voltage control oscillator 50 is started up, the ring oscillator 51 in the voltage control oscillator 50 starts the oscillation. The control voltage Vout is close to 0 immediately after the start-up of the voltage control oscillator 50, and thus each inverter of the ring oscillator 51 is supplied with the power supply current Ib close to a maximum. Accordingly, the voltage control oscillator 50 oscillates at a frequency considerably higher than the target frequency immediately after the start-up.

A capacitor Cb of the first converter 62 is charged until a voltage between terminals becomes the same as the bias voltage Vbias while the clock enable clken is the logic L. When the voltage control oscillator 50 is started up, the switches sw1 and sw2 of the first converter 62 are alternately turned on and off at frequencies higher than the target frequency, and a capacitor Cs repeats charging and discharging at a frequency higher than the target frequency. As a result, the first converter 62 supplies the second converter 63 with the feedback current Iout which is high and is proportional to the high frequency after the start-up.

The second converter 63 is supplied with the feedback current Iout satisfying Iout>Ibias, and raises the control voltage Vout. Accordingly, the voltage control oscillator 50 gradually decreases the frequency of the clock Fout. When the bias current Ibias and the feedback current Iout become approximately equal to each other, the frequency of the clock Fout which is output by the voltage control oscillator 50 is stabilized. In the clock generating apparatus 1 that does not have the starting voltage generator 70 and the starting circuit 80, as shown in the present figure, it requires time for the frequency of the clock Fout to be stabilized after the start-up of the voltage control oscillator 50.

Figure 6:
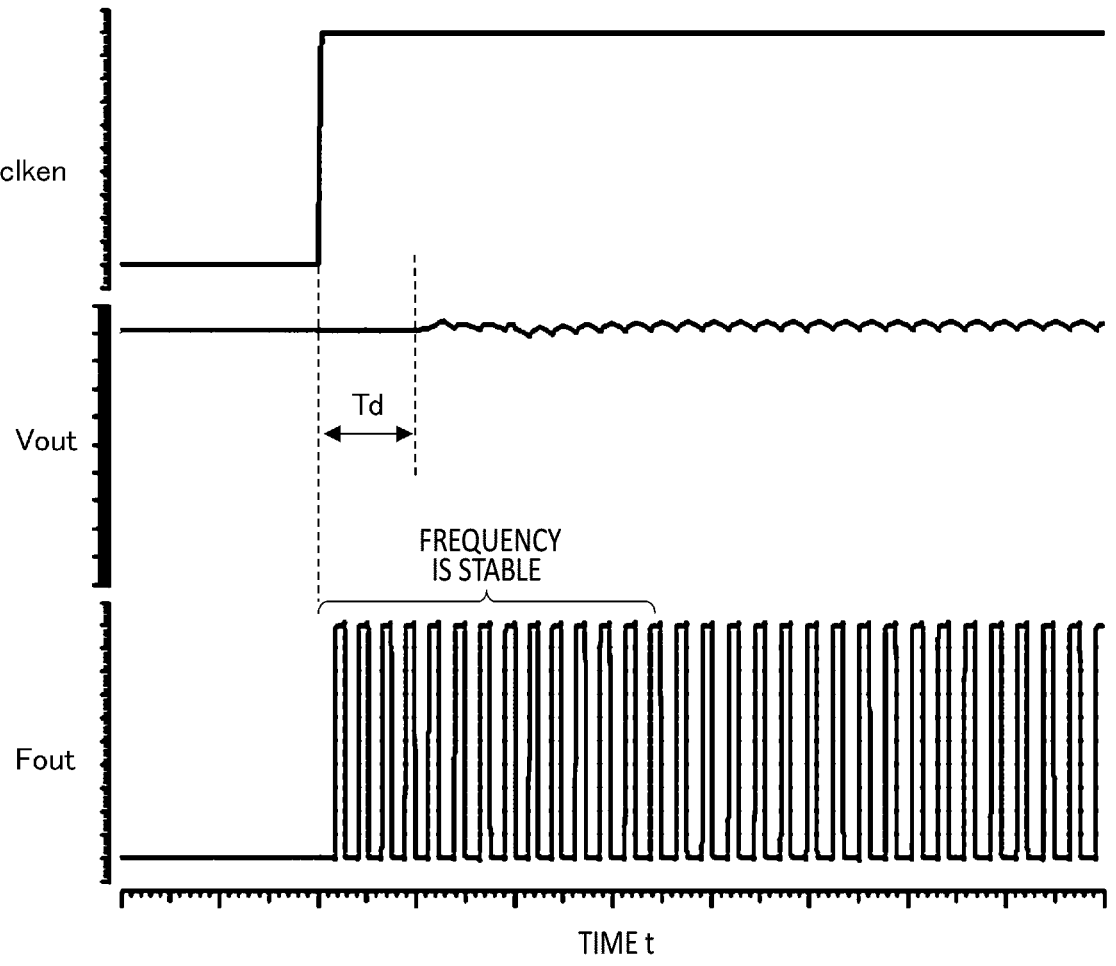
FIG. 6 shows an operation timing of the clock generating apparatus 1.

FIG. 6 shows an operation timing of the clock generating apparatus 1. In the example of the present figure, the clock generating apparatus 1 has the starting voltage generator 70 and the starting circuit 80, and sets the control voltage Vout to the starting voltage Vstart during the start period of the voltage control oscillator 50.

In the example shown in the present figure, the starting circuit 80 shown in FIG. 3 sets the start signal Init to the logic H as shown in FIG. 4 while the clock enable clken is the logic L, and sets the control voltage Vout to the starting voltage Vstart. When the clock enable clken changes from the logic L to the logic H and the voltage control oscillator 50 is started up, the ring oscillator 51 in the voltage control oscillator 50 starts the oscillation.

The starting circuit 80 sets the control voltage Vout to the starting voltage Vstart during the start period after the start-up of the voltage control oscillator 50. In the present embodiment, the starting voltage Vstart is set in advance to be a voltage equal to or close to the control voltage Vout to be supplied to the voltage control oscillator 50 when the frequency of the clock Fout is the target frequency. Accordingly, it is possible for the voltage control oscillator 50 to output the clock Fout having a frequency close to the target frequency even during the start period.

After the start period of the voltage control oscillator 50, the control voltage generator 60 adjusts the control voltage Vout such that the frequency of the clock Fout approaches the target frequency. Here, the starting voltage Vstart is set in advance to a voltage close to the control voltage Vout when the frequency of the clock Fout is the target frequency, and thus after an end of the start period of the voltage control oscillator 50, the control voltage generator 60 can adjust the frequency of the clock Fout to the target frequency by a degree of finely adjusting the control voltage Vout.

With the clock generating apparatus 1 described above, by setting the control voltage Vout to the starting voltage Vstart during the start period after the start-up of the voltage control oscillator 50, it is possible to stabilize the frequency of the clock Fout immediately after the start-up of the voltage control oscillator 50. In addition, by maintaining the control voltage Vout to be the starting voltage Vstart during the start period after the start-up of the voltage control oscillator 50, the clock generating apparatus 1 can reliably suppress a transient phenomenon that may occur in a frequency loop of the ring oscillator 51, in the configuration of controlling the control voltage Vout by the frequency feedback, in a case where immediately after the start-up of the voltage control oscillator 50, the control voltage Vout from the control voltage generator 60, instead of the starting voltage Vstart, is supplied to the voltage control oscillator 50.

It should be noted that the starting voltage Vstart may have a voltage value closer to that of the control voltage Vout which is output by the control voltage generator 60 when the frequency of the clock Fout is the target frequency, than that of the control voltage Vout which is output by the control voltage generator 60 when the frequency of the clock Fout is 0. In addition, a manufacturer or an adjuster of the clock generating apparatus 1 may actually operate a prototype or a sample product of the clock generating apparatus 1, or actually operate the clock generating apparatus 1 when the clock generating apparatus 1 is adjusted at the time of the shipment from the factory or after the shipment from the factory, or the like; measure the voltage value of the control voltage Vout when the frequency of the clock Fout becomes the target frequency; and adjust the starting voltage generator 70 of the clock generating apparatus 1 to output the starting voltage Vstart of the measured voltage value.

The starting voltage generator 70 may generate the starting voltage Vstart for suppressing a variation in the frequency of the voltage control oscillator 50 corresponding to a variation in the temperature. That is, when the oscillation frequency of voltage control oscillator 50 has the temperature dependence, the starting voltage generator 70 may be designed to have temperature dependence for canceling the variation in the frequency of voltage control oscillator 50 corresponding to the variation in the temperature. For example, when the frequency of the voltage control oscillator 50 rises accompanying the rise in the temperature, the starting voltage generator 70 may decrease the starting voltage Vstart accompanying the rise in the temperature, thereby suppressing the rise in the frequency of the voltage control oscillator 50 accompanying the rise in the temperature.

The length Td of the start period may be set in advance to be longer than a period during which the frequency of the clock Fout becomes unstable, and which occurs in a case where the control voltage Vout is not set to the starting voltage Vstart after the start-up of the voltage control oscillator 50, as shown in FIG. 5 as an example. In addition, the manufacturer or the adjuster of the clock generating apparatus 1 may actually operate the prototype or the sample product of the clock generating apparatus 1, or actually operate the clock generating apparatus 1 when the clock generating apparatus 1 is adjusted at the time of the shipment from the factory or after the shipment from the factory, or the like; measure the length of such a period during which the frequency of the clock Fout becomes unstable; and set the length Td of the start period.

The start period may be a period that is equal to or greater than one cycle of the clock. This makes it possible for the control voltage generator 60 to receive the starting voltage Vstart as the control voltage Vout for at least one cycle before the end of the start period, and adjust in advance the control voltage Vout according to the clock Fout which is output by the voltage control oscillator 50 in a state in which a stable power supply current is supplied to each inverter.

The start period may be a period until the voltage control oscillator 50 outputs a predetermined number of clock pulses, after the start-up of the voltage control oscillator 50. In this case, the starting circuit 80 may receive the clock Fout as indicated by a dashed line in FIG. 3; count the clock pulses which are input after the start-up of the voltage control oscillator 50; and set the start signal Init to the logic L, according to the input of the predetermined number of clock pulses (for example, the number which is one or which is equal to or greater than two), to end the start period. This makes it possible for the starting circuit 80 to end the start period according to the clock pulse circulating in the ring oscillator 51 a predetermined number of times, without depending on the transient variation in the clock frequency.

Figure 7:
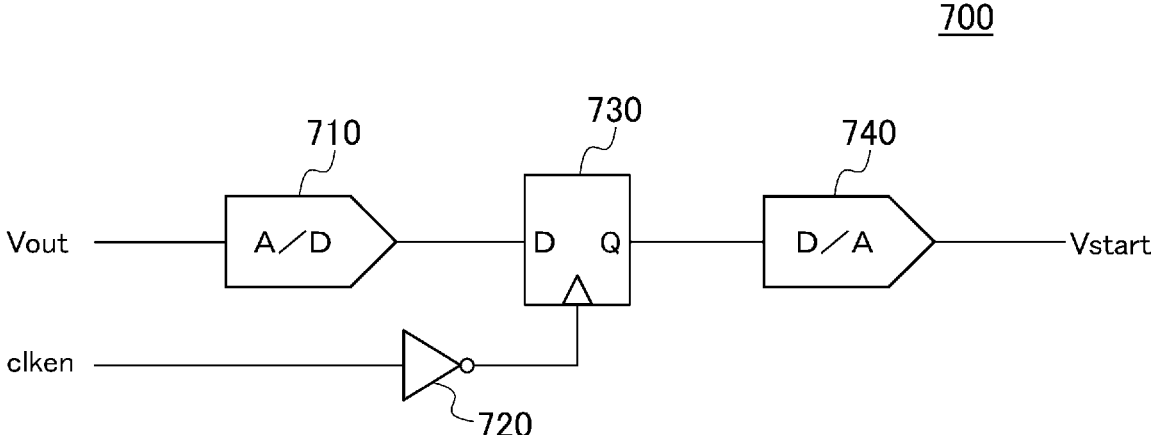
FIG. 7 shows a configuration of a starting voltage generator 700 according to a modification example of the first embodiment.

FIG. 7 shows a configuration of a starting voltage generator 700 according to a modification example of the first embodiment. The clock generating apparatus 1 may include the starting voltage generator 700 instead of the starting voltage generator 70 shown in FIG. 3. The starting voltage generator 700 has an AD converter 710, a NOT logic element 720, a flip-flop (FF) 730, and a DA converter 740.

The AD converter 710 is connected to the control voltage generator 60, and receives the control voltage Vout which is supplied to the voltage control oscillator 50. In FIG. 1, an arrow of a dashed line indicates a path through which the control voltage Vout is input from the control voltage generator 60 to the starting voltage generator 700 when the starting voltage generator 700 is used as the starting voltage generator 70. The AD converter 710 converts the input voltage of the control voltage Vout into the digital value. The NOT logic element 720 inverts the logic value of the clock enable clken.

The FF 730 is connected to the AD converter 710 and the NOT logic element 720. The FF 730 is an example of a storage unit that stores a voltage value of the control voltage Vout during the start of the voltage control oscillator 50. In the example of the present figure, the FF 730 latches the value of the digital control voltage Vout at a rise timing of a logically inverted value of the clock enable clken, that is, at a fall timing of the clock enable clken, and hold the latched value of the digital control voltage Vout until the next fall timing of the clock enable clken. This makes it possible for the FF 730 to store the voltage value of the control voltage Vout during the start and immediately before the stop of the voltage control oscillator 50.

The DA converter 740 is connected to the FF 730. The DA converter 740 converts the digital voltage value stored in the FF 730 into an analog voltage. This makes it possible for the starting voltage generator 700 to generate the starting voltage Vstart corresponding to the voltage value stored in the storage unit such as the FF 730 during the start period in a case where the voltage control oscillator 50 is once stopped and then restarted.

With the starting voltage generator 700 described above, it is possible to generate the starting voltage Vstart which is equal to the control voltage Vout supplied to the voltage control oscillator 50 in the immediately previous start period of the voltage control oscillator 50, and thus it is possible to more appropriately adjust the starting voltage Vstart.

In the starting voltage generator 700 described above, the FF 730 is a volatile storage device in which the stored value is lost when the power supply to the clock generating apparatus 1 is stopped. The starting voltage generator 700 may use, instead of the FF 730, as the storage device, a non-volatile memory in which the stored value is not lost even when the power supply to the clock generating apparatus 1 is stopped. This makes it possible for the clock generating apparatus 1 to use the starting voltage Vstart corresponding to the voltage value stored in the non-volatile memory even at the time of the start after the power supply is stopped.

The starting voltage generator 700 described above once converts the control voltage Vout during the start of the voltage control oscillator 50 into the digital value. Instead of this, the starting voltage generator 700 may store the control voltage Vout as an analog value as it is, by using the control voltage Vout during the start of the voltage control oscillator 50 to charge the capacitor, and by storing the control voltage Vout in the capacitor, or the like.

Figure 8:
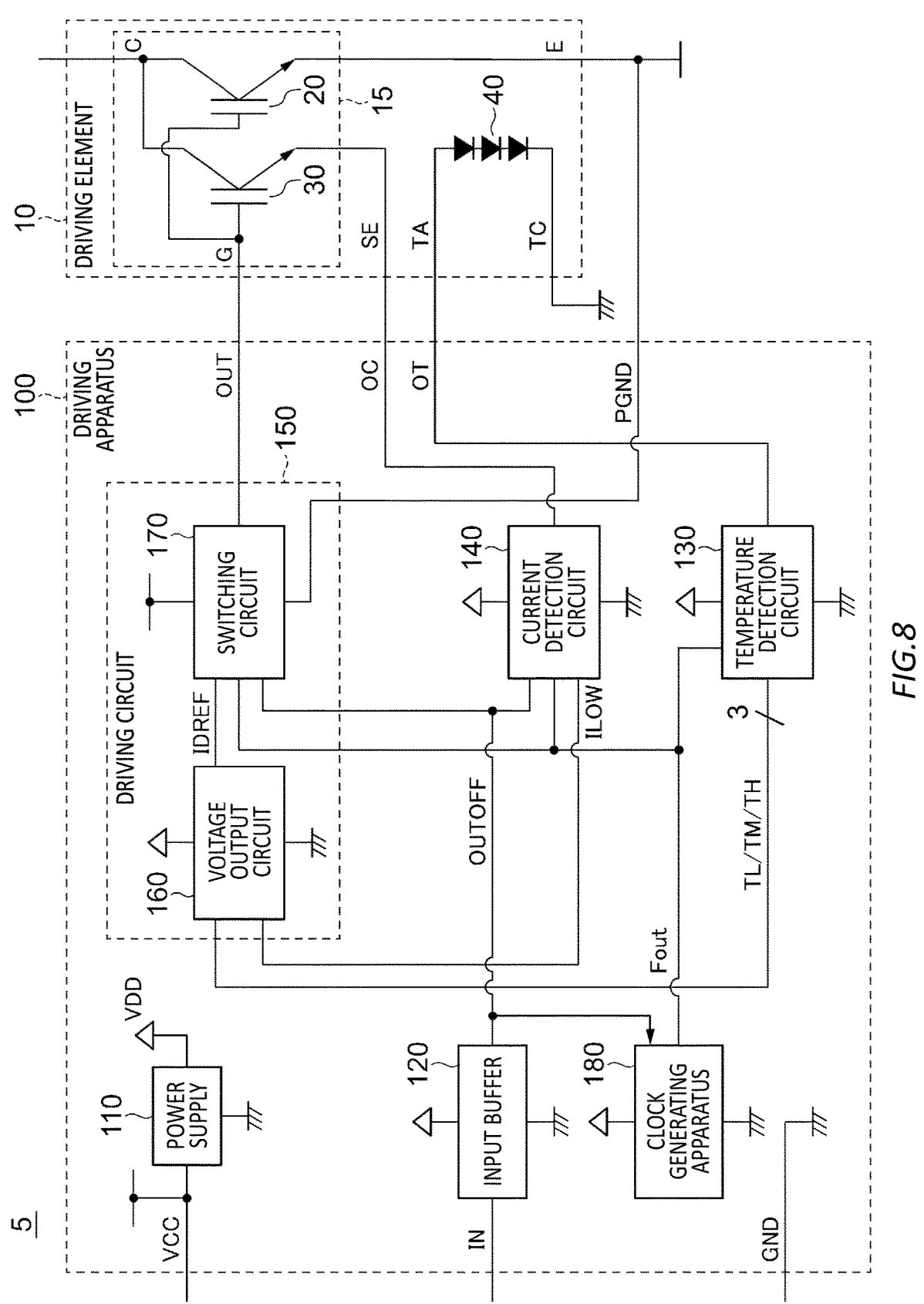
FIG. 8 shows a configuration of an apparatus 5 according to a second embodiment.

FIG. 8 shows a configuration of an apparatus 5 according to a second embodiment. The apparatus 5 includes a driving element 10 and a driving apparatus 100.

The driving element 10 includes a switching device 15 and a temperature sensor 40. The switching device 15 is a semiconductor switching device such as an IGBT (Insulated Gate Bipolar Transistor) or a MOSFET (Metal-Oxide-Semiconductor Field-Effect Transistor). The switching device 15 may be a SiC-IGBT or a SiC-MOSFET that is capable of switching at a higher speed. The switching device 15 includes a first main terminal, a second main terminal, and a control terminal which controls a connected state between the first main terminal and the second main terminal. The switching device 15 includes a collector ("C" in the figure) and an emitter ("E" in the figure) as the first main terminal and the second main terminal, and includes a gate ("G" in the figure) as the control terminal. When the switching device 15 is a MOSFET, the switching device 15 includes a drain and a source as the first main terminal and the second main terminal, and includes a gate as the control terminal. In the present embodiment, for convenience of descriptions, the switching device 15 that is an IGBT is shown.

The switching device 15 includes a main switching device 20 as a main cell that causes a main current to flow and a sense switching device 30 as a current sense cell that causes a sense current to flow, and has a configuration in which the main cell is connected between the collector and the emitter, the current sense cell is connected between the collector and a sense emitter and the gate of the switching device 15 is connected to the gates of both the main cell and the current sense cell. The current sense cell is set to have an area ratio smaller than 1/1000 that of the main cell, or the like, and causes a sense current of a ratio corresponding to the area ratio (for example, 1/1000) to flow with respect to the main current in a steady state.

The temperature sensor 40 is arranged near the switching device 15 and detects a temperature of the switching device 15. In the present embodiment, a thermal diode is used as an example of the temperature sensor 40. Alternatively, the temperature sensor 40 may be another type of temperature sensor.

The driving apparatus 100 drives the switching device 15 of the driving element 10. The driving apparatus 100 includes a power supply 110, an input buffer 120, a temperature detection circuit 130, a current detection circuit 140, and a driving circuit 150. The power supply 110 is, for example, a voltage regulator. The power supply 110 converts a power supply voltage VCC input from outside into a power supply voltage VDD to be used inside the driving apparatus 100.

The input buffer 120 amplifies a control signal IN input from outside, and outputs it as a control signal OUTOFF. The control signal OUTOFF is a signal that instructs the switching device 15 to be in a disconnected state in a case of the logic H (high), and the switching device 15 to be in a connected state in a case of the logic L (low).

The temperature detection circuit 130 is connected to the temperature sensor 40 inside the driving element 10. The temperature detection circuit 130 receives a detection value OT of the temperature sensor 40, and outputs a temperature detection signal corresponding to the temperature of the switching device 15 (for example, TL/TM/TH in the figure).

The current detection circuit 140 is connected to a sense terminal SE of the switching device 15 (the emitter terminal of the sense switching device 30) and to the input buffer 120. The current detection circuit 140 receives a detection value OC corresponding to a current that flows in the sense terminal SE of the switching device 15, and outputs a current detection signal corresponding to the current that flows in the switching device 15 (for example, ILOW in the figure). The current detection circuit 140 according to the present embodiment samples, at a timing during an ON period of the switching device 15, the current detection signal corresponding to the current that flows in the switching device 15, and outputs a result of the sampling at a timing of ending the ON period of the switching device 15.

The driving circuit 150 is connected to the input buffer 120, the temperature detection circuit 130, and the current detection circuit 140. The driving circuit 150 performs an on and off control of the switching device 15 by driving a control terminal G (the gate) of the switching device 15 according to the control signal OUTOFF. Herein, the driving circuit 150 can change the switching speed of the switching device 15 by adjusting, according to the temperature detection signal and the current detection signal, a driving current to be supplied to the control terminal G of the switching device 15.

The driving circuit 150 includes a voltage output circuit 160 and a switching circuit 170. The voltage output circuit 160 is connected to the temperature detection circuit 130 and the current detection circuit 140. The voltage output circuit 160 outputs a control voltage IDREF corresponding to the temperature detection signal TL/TM/TH from the temperature detection circuit 130 and the current detection signal ILOW from the current detection circuit 140.

The switching circuit 170 is connected to the input buffer 120 and the voltage output circuit 160. The switching circuit 170 outputs a driving signal OUT corresponding to the control signal OUTOFF from the input buffer 120 to the switching device 15, to thus drive the control terminal G of the switching device 15. The switching circuit 170 adjusts, according to the control voltage IDREF, the driving current to be supplied to the control terminal G when driving the control terminal G.

The driving apparatus 100 further has a clock generating apparatus 180. The clock generating apparatus 180 may be a clock generating apparatus that generates the clock of the clock generating apparatus 1 according to the first embodiment shown in FIG. 1 to FIG. 6, or the clock generating apparatus 1 or the like according to the modification example shown in FIG. 7 or the like. The clock generating apparatus 180 supplies the clock Fout to each circuit in driving apparatus 100, such as the temperature detection circuit 130, the current detection circuit 140, and the driving circuit 150. Accordingly, the clock generating apparatus 180 supplies the clocks to timers that are used to keep time in various circuits in the driving apparatus 100.

In the present embodiment, the clock generating apparatus 180 receives, from the input buffer 120, the control signal OUTOFF obtained by amplifying the control signal IN which is input from the outside of the apparatus 5. The clock generating apparatus 180 uses an inverted value of the control signal OUTOFF as the clock enable clken. Accordingly, the voltage control oscillator 50 in the clock generating apparatus 180 is started according to the control signal (the control signal OUTOFF=the logic L, and the clock enable clken=the logic H) for providing the instruction to turn on the switching device 15, and is stopped according to the control signal (the control signal OUTOFF=the logic H, and the clock enable clken=the logic L) for providing the instruction to turn off the switching device 15.

With the apparatus 5 shown in the present figure, by using, as the clock generating apparatus 180, the clock generating apparatus 1 according to the first embodiment shown in FIG. 1 to FIG. 6, or the clock generating apparatus 1 according to the modification example shown in FIG. 7 or the like, it is possible to stop the generation of the clock Fout while the switching device 15 is turned off, and to start the voltage control oscillator 50 at the timing when the switching device 15 is switched from off to on, and start the generation of the clock Fout. Then, the clock generating apparatus 180 can stabilize the frequency of the clock Fout immediately after the start-up of the voltage control oscillator 50, and thus the apparatus 5 can keep more accurate time by using various types of timers that measure elapsed times and the like after the switching device 15 is turned on. It should be noted that when a timer is provided in the input buffer 120 as well, the clock generating apparatus 180 may supply the clock Fout to the input buffer 120 as well.

Figure 9:
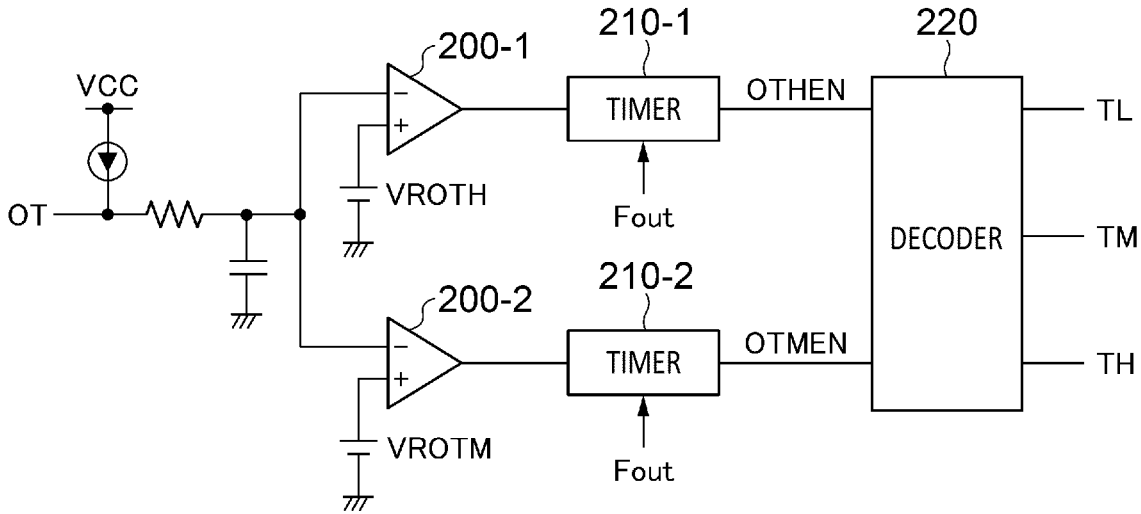
FIG. 9 shows a configuration of a temperature detection circuit 130 according to the second embodiment.

FIG. 9 shows a configuration of a temperature detection circuit 130 according to the present embodiment. The temperature detection circuit 130 includes one or more comparators 200-1 and 200-2 (also referred to as "comparators 200"), one or more timers 210-1 and 210-2 (also referred to as "timers 210"), a decoder 220, and other circuit elements. A constant current source connected between the power supply voltage VCC and the temperature sensor 40 ("detection value OT" in the figure) causes a constant current to flow in the temperature sensor 40. Accordingly, the temperature sensor 40 generates a voltage corresponding to the temperature of the switching device 15 as the detection value OT. A smoothing filter of an RC integration circuit or the like smoothens the detection value OT.

One or more comparators 200 classify the detection values OT into a plurality of voltage ranges. In the example shown in the present figure, the comparators 200-1 and 200-2 classify the detection values OT into a range equal to or smaller than a voltage threshold VROTH (temperature T2), a range which exceeds the voltage threshold VROTH and is equal to or smaller than a voltage threshold VROTM (T1≤temperature<T2), and a range exceeding the voltage threshold VROTM (temperature<T1), and outputs signals OTHEN and OTMEN indicating the classification result. The timers 210-1 and 210-2 delay, by a predetermined time, the signals OTHEN and OTMEN which are output by the comparators 200-1 and 200-2, and output the delayed signals OTHEN and OTMEN to the decoder 220. Here, according to the signals OTHEN and OTMEN being maintained at the same value for a predetermined time, the timers 210-1 and 210-2 output the values to the decoder 220. The timers 210-1 and 210-2 may measure the elapsed times after the values of signals OTHEN and OTMEN change, by counting the number of clock pulses of the clock Fout from the clock generating apparatus 180. The decoder 220 decodes the signals OTHEN and OTMEN and outputs the decoded signals as the temperature detection signals TL/TM/TH obtained by classifying the temperature of the switching device 15 into the plurality of temperature ranges.

FIG. 10 shows an input and output of the temperature detection circuit 130 according to the present embodiment. The comparator 200-1 outputs the signal OTHEN that becomes a logic 1 when the detection value OT is equal to or smaller than the voltage threshold VROTH (temperature T2) and that becomes a logic 0 when the detection value OT exceeds the voltage threshold VROTH (temperature<T2). The comparator 200-2 outputs the signal OTMEN that becomes the logic 1 when the detection value OT is equal to or smaller than the voltage threshold VROTM (temperature T1) and that becomes the logic 0 when the detection value OT exceeds the voltage threshold VROTM (temperature<T). The decoder 220 decodes such signals OTHEN and OTMEN and sets the temperature detection signal TL to be the logic 1 in the case of temperature<T1, the temperature detection signal TM to be the logic 1 in the case of T1 temperature<T2, and the temperature detection signal TH to be the logic 1 in the case of T2 temperature.

Figure 11:
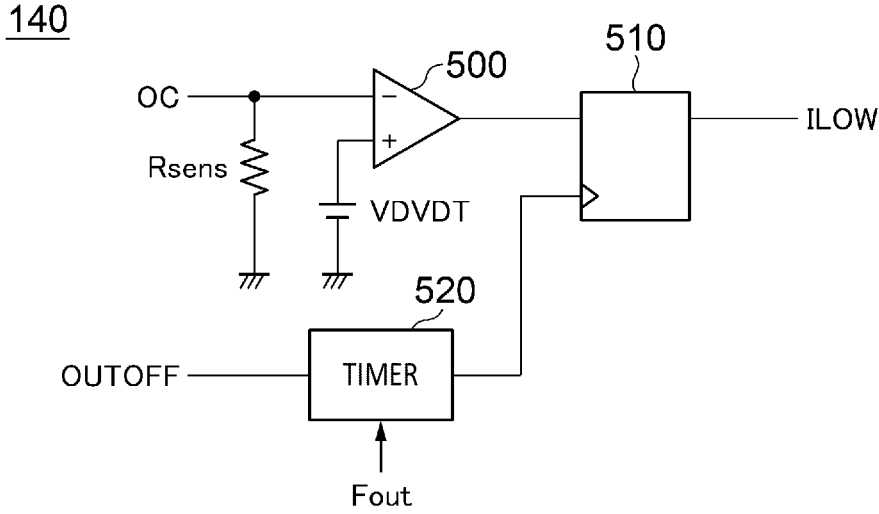
FIG. 11 shows a configuration of a current detection circuit 140 according to the second embodiment.

FIG. 11 shows a configuration of a current detection circuit 140 according to the present embodiment. The current detection circuit 140 includes a sense resistor Rsens, a comparator 500, and a flip-flop 510. The sense resistor Rsens is connected between the sense terminal of the switching device 15 and a reference potential (a ground potential in the example shown in the present figure), and causes a sense current proportional to the current that flows in the switching device 15 to flow. Accordingly, the detection value OC becomes a voltage value corresponding to the current that flows in the switching device 15.

The comparator 500 compares the detection value OC and a threshold voltage VDVDT. The comparator 500 outputs the logic 1 to ILOW when the detection value OC is smaller than the threshold voltage VDVDT (current that flows in switching device 15<|1), and outputs the logic 0 when the detection value OC is equal to or larger than the threshold voltage VDVDT (current that flows in switching device 15≥|1). The signal output by the comparator 500 is an example of the current detection signal corresponding to the current that flows in the switching device 15.

The flip-flop 510 samples, at a timing during an ON period of the switching device 15, the current detection signal corresponding to the current that flows in the switching device 15. In the present figure, the flip-flop 510 latches the current detection signal at a timing of a rise of the control signal OUTOFF. Accordingly, the flip-flop 510 can sample the current detection signal corresponding to the current that flows in the switching device 15 at an end timing of the steady state where the switching device 15 is ON. The flip-flop 510 outputs the sampled current detection signal as ILOW.

The current detection circuit 140 may include a timer 520. The timer 520 forcibly raises the control signal OUTOFF which is supplied to the flip-flop 510, when the control signal OUTOFF is the logic L during a predetermined maximum ON time. By providing each timer that is provided in the driving apparatus 100 with such a function, even in a case where the control signal IN or OUTOFF is fixed to be the logic Las is due to a failure or the like of an apparatus external to the driving apparatus 100 or the input buffer 120, when an ON time of the switching device 15 exceeds the maximum ON time, the driving apparatus 100 can forcibly set the control signal OUTOFF in the driving apparatus 100 to the logic H to forcibly shut off the switching device 15, and perform various types of operations accompanying the shutoff of the switching device 15.

FIG. 12 shows an input and output of a voltage output circuit 160 according to the present embodiment. The voltage output circuit 160 outputs a voltage V1 as the control voltage IDREF in the case of temperature detection signal TH=1 (logic 1) (in the case of temperature≥T2). The voltage output circuit 160 outputs a voltage V2 (<V1) as the control voltage IDREF in the case of temperature detection signal TM=1 (in the case of T1 temperature<T2).

In the case of temperature detection signal TL=1 and also current detection signal ILOW=0 (in the case of temperature<T1 and also current indicated by current detection signal ILOW 11), the voltage output circuit 160 outputs a voltage V3 (<V2) between the resistors R3 and R4 as the control voltage IDREF. For the voltage output circuit 160, in the case of temperature detection signal TL=1 and also current detection signal ILOW=1 (in the case of temperature<T1 and also current indicated by current detection signal ILOW<|1), the voltage output circuit 160 outputs a voltage V4 (<V3) between the resistors R4 and R5 as the control voltage IDREF.

Figure 13:
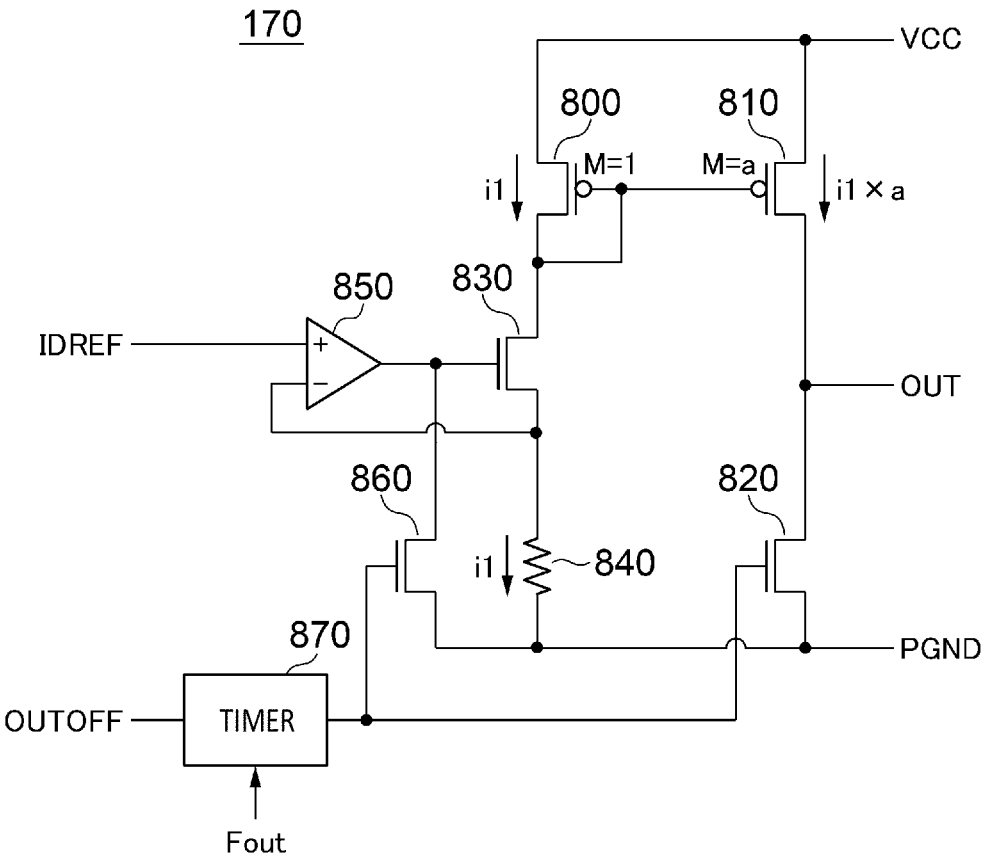
FIG. 13 shows a configuration of a switching circuit 170 according to the second embodiment.

FIG. 13 shows a configuration of a switching circuit 170 according to the present embodiment. The switching circuit 170 includes a MOSFET 800, a MOSFET 810, a MOSFET 820, a MOSFET 830, a resistor 840, a differential amplifier circuit 850, and a MOSFET 860. The MOSFET 800 and the MOSFET 810 function as a current mirror circuit that outputs a driving current i1×a obtained by amplifying a current i1 (an inter-DS current of the MOSFET 800) supplied to the MOSFET 800 by a times, to the control terminal G of the switching device 15. A source of the MOSFET 800 is connected to the power supply voltage VCC so that a connection is made between the gate and the drain. In the MOSFET 810, a source is connected to the power supply voltage VCC, a gate is connected to the gate of the MOSFET 800, and a drain is connected to the control terminal G of the switching device 15 as the output end of the switching circuit 170.

The MOSFET 820 is connected in series with the MOSFET 810 between the power supply voltage VCC and the reference potential PGND (the emitter potential of the switching device 15), and the control signal OUTOFF from the input buffer 120 is input to the gate. The MOSFET 820 is turned off when the control signal OUTOFF is 0. In this case, the MOSFET 810 outputs the driving current to the control terminal G of the switching device 15. The MOSFET 820 is turned on when the control signal OUTOFF is 1, and connects the control terminal G of the switching device 15 to the reference potential PGND and turns off the switching device 15.

The MOSFET 830, the resistor 840, and the differential amplifier circuit 850 are a current control circuit that supplies a current corresponding to the control voltage IDREF from the voltage output circuit 160 to the current mirror circuit constituted of the MOSFET 800 and the MOSFET 810. The MOSFET 830 and the resistor 840 are connected in series between the drain of the MOSFET 800 and the reference potential PGND. In the differential amplifier circuit 850, the control voltage IDREF is input to a positive terminal, and a voltage between the MOSFET 830 and the resistor 840 is input to a negative terminal. An output terminal of the differential amplifier circuit 850 is connected to the gate of the MOSFET 830. When the control signal OUTOFF is 0, the differential amplifier circuit 850 controls the MOSFET 830 such that a potential between the MOSFET 830 and the resistor 840 becomes a potential of the control voltage IDREF. Accordingly, when the control signal OUTOFF is 0, the resistor 840 causes the current i1 having a current value obtained by dividing the control voltage IDREF by a resistance value of the resistor 840 to flow through a path of the MOSFET 800, the MOSFET 830, and the resistor 840.

The MOSFET 860 is connected between the gate of the MOSFET 830 and the reference potential PGND, and the control signal OUTOFF is input to the gate. The MOSFET 860 is turned off when the control signal OUTOFF is 0. The MOSFET 860 is turned on when the control signal OUTOFF is 1, and the MOSFET 830 is forcibly turned off so as not to cause a current to flow in the MOSFET 800 (current i1=0).

When the control voltage OUTOFF is 0, the switching circuit 170 described above can supply a driving current obtained by amplifying the current corresponding to the control voltage IDREF by the current mirror circuit to the switching device 15, to thus turn on the switching device 15. Further, when the control voltage OUTOFF is 1, the switching device 15 can be turned off by setting the control terminal G of the switching device 15 to be the reference potential PGND.

The switching circuit 170 may include a timer 870. The timer 870 forcibly raises the control signal OUTOFF which is supplied to the MOSFET 820 and the MOSFET 860 when the control signal OUTOFF is the logic L during a predetermined maximum ON time. Accordingly, even in a case where the control signal IN or OUTOFF is fixed to be the logic Las is due to a failure or the like of an apparatus external to the driving apparatus 100 or the input buffer 120, when an ON time of the switching device 15 exceeds the maximum ON time, the driving apparatus 100 can forcibly set the control signal OUTOFF in the driving apparatus 100 to the logic H to forcibly shut off the switching device 15.

While the embodiment of the present invention has been described, the technical scope of the present invention is not limited to the above described embodiment. It is apparent to persons skilled in the art that various alterations and improvements can be added to the above described embodiment. It is also apparent from the description of the claims that the embodiments to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

1: clock generating apparatus;
5: apparatus;
10: driving element;
15: switching device;
20: main switching device;
30: sense switching device;
40: temperature sensor;
50: voltage control oscillator;
51: ring oscillator;
52: amplifier;
53: alternate clock generating circuit;
60: control voltage generator;
61: bias current source;
62: first converter;
63: second converter;
70: starting voltage generator;
80: starting circuit;
81: delay circuit;
100: driving apparatus;
110: power supply;
120: input buffer;
130: temperature detection circuit;
140: current detection circuit;
150: driving circuit;
160: voltage output circuit;
170: switching circuit;
180: clock generating apparatus;
200-1 and 200-2: comparator;
210-1 and 210-2: timer;
220: decoder;
500: comparator;
510: flip-flop;
520: timer;
700: starting voltage generator;
710: AD converter;
720: NOT logic element;
730: FF;
740: DA converter;
800 MOSFET;
810-1 to 810-4: MOSFET;
820: MOSFET;

830: MOSFET;
840: resistor;
850: differential amplifier circuit;
860: MOSFET;
870: timer.

What is claimed is:

1. A clock generating apparatus comprising: a voltage control oscillator that outputs a clock corresponding to an input control voltage a control voltage generator that generates the control voltage corresponding to a difference between a frequency of the clock and a target frequency; a starting voltage generator that generates a starting voltage for selective input to the voltage control oscillator during a start period prior to normal operation of the voltage control oscillator and a starting circuit that sets the control voltage input to the voltage control oscillator to the starting voltage during the start period prior to normal operation of the voltage control oscillator, the starting circuit removing the starting voltage from input to the voltage control oscillator during normal operation of the voltage control oscillator after the start period of the voltage control oscillator.

2. The clock generating apparatus according to claim 1, wherein the start period is a period that is equal to or greater than one cycle of the clock.

3. A driving apparatus that drives a switching device, the driving apparatus comprising:
   a driving circuit that performs an on and off control of the switching device according to a control signal which is input; and
   the clock generating apparatus according to claim 2, wherein
   the clock generating apparatus supplies the clock to a timer that is used to keep time in the driving apparatus.

4. The driving apparatus according to claim 3, wherein the voltage control oscillator is started according to the control signal for providing an instruction to turn on the switching device, and is stopped according to the control signal for providing an instruction to turn off the switching device.

5. The clock generating apparatus according to claim 1, wherein the start period is a period until the voltage control oscillator outputs a predetermined number of clock pulses, after the start-up of the voltage control oscillator.

6. A driving apparatus that drives a switching device, the driving apparatus comprising:
   a driving circuit that performs an on and off control of the switching device according to a control signal which is input; and
   the clock generating apparatus according to claim 5, wherein
   the clock generating apparatus supplies the clock to a timer that is used to keep time in the driving apparatus.

7. The driving apparatus according to claim 6, wherein the voltage control oscillator is started according to the control signal for providing an instruction to turn on the switching device, and is stopped according to the control signal for providing an instruction to turn off the switching device.

8. The clock generating apparatus according to claim 1, wherein the starting voltage generator generates the starting voltage for suppressing a variation in frequency of the voltage control oscillator corresponding to a variation in temperature.

9. A driving apparatus that drives a switching device, the driving apparatus comprising:
   a driving circuit that performs an on and off control of the switching device according to a control signal which is input; and the clock generating apparatus according to claim 8, wherein
   the clock generating apparatus supplies the clock to a timer that is used to keep time in the driving apparatus.

10. The driving apparatus according to claim 9, wherein the voltage control oscillator is started according to the control signal for providing an instruction to turn on the switching device, and is stopped according to the control signal for providing an instruction to turn off the switching device.

11. The clock generating apparatus according to claim 1, wherein
   the starting voltage generator
   has a storage unit that stores a voltage value of the control voltage during a start of the voltage control oscillator, and
   generates the starting voltage corresponding to the voltage value stored in the storage unit during the start period in a case where the voltage control oscillator is once stopped and then restarted.

12. The clock generating apparatus according to claim 11, wherein the storage unit is a non-volatile memory.

13. A driving apparatus that drives a switching device, the driving apparatus comprising:
   a driving circuit that performs an on and off control of the switching device according to a control signal which is input; and
   the clock generating apparatus according to claim 12, wherein
   the clock generating apparatus supplies the clock to a timer that is used to keep time in the driving apparatus.

14. The driving apparatus according to claim 13, wherein the voltage control oscillator is started according to the control signal for providing an instruction to turn on the switching device, and is stopped according to the control signal for providing an instruction to turn off the switching device.

15. A driving apparatus that drives a switching device, the driving apparatus comprising:
   a driving circuit that performs an on and off control of the switching device according to a control signal which is input; and
   the clock generating apparatus according to claim 11, wherein
   the clock generating apparatus supplies the clock to a timer that is used to keep time in the driving apparatus.

16. The driving apparatus according to claim 15, wherein the voltage control oscillator is started according to the control signal for providing an instruction to turn on the switching device, and is stopped according to the control signal for providing an instruction to turn off the switching device.

17. A driving apparatus that drives a switching device, the driving apparatus comprising:
   a driving circuit that performs an on and off control of the switching device according to a control signal which is input; and
   the clock generating apparatus according to claim 1, wherein
   the clock generating apparatus supplies the clock to a timer that is used to keep time in the driving apparatus.

18. A driving apparatus that drives a switching device, the driving apparatus comprising: a driving circuit that performs an on and off control of the switching device according to a control signal which is input; and a clock generating apparatus comprising: a voltage control oscillator that outputs a clock corresponding to a control voltage which is input to a singular control input; a control voltage generator having an output connected to the singular control input of the voltage control oscillator, the control voltage generator generates a control voltage corresponding to a difference between a frequency of the clock and a target frequency; a starting voltage generator that generates a starting voltage on the singular control input supplied to the voltage control oscillator, the starting voltage being active during a start period of the voltage control oscillator; and a starting circuit having an output directly coupled to the singular control input of the voltage control oscillator, the starting circuit sets the starting voltage during the start period after a start-up of the voltage control oscillator, wherein the clock generating apparatus supplies the clock to a timer that is used to keep time in the driving apparatus, and The driving apparatus according to claim 8, wherein the voltage control oscillator is started according to the control signal for providing an instruction to turn on the switching device, and is stopped according to the control signal for providing an instruction to turn off the switching device.

19. A clock generating apparatus 1, comprising: a voltage control oscillator that outputs a clock corresponding to a control voltage which is input to a singular control input; a control voltage generator having an output connected to the singular control input of the voltage control oscillator, the control voltage generator generates a control voltage corresponding to a difference between a frequency of the clock and a target frequency; a starting voltage generator that generates a starting voltage on the singular control input supplied to the voltage control oscillator, the starting voltage being active during a start period of the voltage control oscillator; and a starting circuit having an output directly coupled to the singular control input of the voltage control oscillator, the starting circuit sets the starting voltage during the start period after a start-up of the voltage control oscillator, wherein the control voltage generator has: a bias current source that generates a bias current corresponding to the target frequency; a first converter that outputs a feedback current corresponding to the frequency of the clock; and a second converter that outputs the control voltage corresponding to a difference between the bias current and the feedback current.

20. A driving apparatus that drives a switching device, the driving apparatus comprising:

a driving circuit that performs an on and off control of the switching device according to a control signal which is input; and the clock generating apparatus according to claim 19, wherein the clock generating apparatus supplies the clock to a timer that is used to keep time in the driving apparatus.

* * * * *